(12) United States Patent
Dubois et al.

(10) Patent No.: US 11,673,801 B2
(45) Date of Patent: Jun. 13, 2023

(54) ONE-PIECE, HOLLOW MICROMECHANICAL PART WITH SEVERAL FUNCTIONAL LEVELS FORMED OF A SYNTHETIC CARBON ALLOTROPE BASED MATERIAL

(71) Applicant: NIVAROX-FAR S.A., Le Locle (CH)

(72) Inventors: Philippe Dubois, Marin (CH);
Sebastiano Merzaghi, Lausanne (CH);
Christian Charbon, Chezard-St-Martin (CH)

(73) Assignee: NIVAROX-FAR S.A., Le Locle (CH)

( * ) Notice: Subject to any disclaimer, the term of this patent is extended or adjusted under 35 U.S.C. 154(b) by 1230 days.

(21) Appl. No.: 16/144,201

(22) Filed: Sep. 27, 2018

(65) Prior Publication Data

US 2019/0023564 A1    Jan. 24, 2019

Related U.S. Application Data

(62) Division of application No. 15/030,710, filed as application No. PCT/EP2014/071301 on Oct. 6, 2014, now Pat. No. 10,106,400.

(30) Foreign Application Priority Data

Nov. 8, 2013    (EP) ..................................... 13192133

(51) Int. Cl.
*B81C 99/00*     (2010.01)
*G04B 13/02*     (2006.01)
(Continued)

(52) U.S. Cl.
CPC .......... *B81C 99/0085* (2013.01); *G04B 13/00* (2013.01); *G04B 13/02* (2013.01);
(Continued)

(58) Field of Classification Search
CPC ........ G04B 13/00; G04B 15/14; G04B 19/12; B81B 2201/035; B81B 3/0075; B81C 99/0085
(Continued)

(56) References Cited

U.S. PATENT DOCUMENTS

| | | |
|---|---|---|
| 5,242,711 A | 9/1993 | Denatale et al. |
| 5,334,342 A | 8/1994 | Harker et al. |

(Continued)

FOREIGN PATENT DOCUMENTS

| | | | |
|---|---|---|---|
| CH | 705433 B1 * | 3/2013 | ......... B81C 99/0095 |
| EP | 2405301 A1 * | 1/2012 | ......... B81C 99/0085 |
| WO | 2012/104110 A1 | 8/2012 | |

OTHER PUBLICATIONS

International Search Report dated Oct. 29, 2014 in PCT/EP2014/071301 filed Oct. 6, 2014.

(Continued)

*Primary Examiner* — Edwin A. Leon
*Assistant Examiner* — Kevin Andrew Johnston
(74) *Attorney, Agent, or Firm* — Oblon, McClelland, Maier & Neustadt, L.L.P.

(57) ABSTRACT

A method for fabrication of a micromechanical part made of a one-piece synthetic carbon allotrope based material, the method including: forming a substrate with a negative cavity of the micromechanical part to be fabricated; coating the negative cavity of the substrate with a layer of the synthetic carbon allotrope based material in a smaller thickness than the depth of the negative cavity; and removing the substrate to release the one-piece micromechanical part formed in the negative cavity.

19 Claims, 6 Drawing Sheets

(51) Int. Cl.

| | |
|---|---|
| *G04B 37/22* | (2006.01) |
| *G04B 19/04* | (2006.01) |
| *G04B 29/02* | (2006.01) |
| *G04B 17/06* | (2006.01) |
| *G04B 39/00* | (2006.01) |
| *G04B 13/00* | (2006.01) |
| *G04B 15/14* | (2006.01) |
| *G04B 19/12* | (2006.01) |

(52) U.S. Cl.
CPC ........... *G04B 15/14* (2013.01); *G04B 17/063* (2013.01); *G04B 17/066* (2013.01); *G04B 19/042* (2013.01); *G04B 19/12* (2013.01); *G04B 29/027* (2013.01); *G04B 37/22* (2013.01); *G04B 39/004* (2013.01); *B81B 2201/035* (2013.01)

(58) Field of Classification Search
USPC ........................................................ 368/327
See application file for complete search history.

(56) References Cited

U.S. PATENT DOCUMENTS

| | | |
|---|---|---|
| 5,660,680 A | 8/1997 | Keller |
| 2010/0054089 A1 | 3/2010 | Maier et al. |
| 2010/0236934 A1 | 9/2010 | Cusin et al. |
| 2010/0308010 A1* | 12/2010 | Cusin ..................... C25D 5/022 |
| | | 216/19 |
| 2012/0199996 A1* | 8/2012 | Cusin .................. B81C 99/0085 |
| | | 264/81 |
| 2012/0263909 A1* | 10/2012 | Gluche ................ G04B 17/066 |
| | | 216/66 |
| 2013/0167606 A1 | 7/2013 | Winkler et al. |
| 2013/0213800 A1 | 8/2013 | Cusin et al. |
| 2014/0096392 A1 | 4/2014 | Maier et al. |

OTHER PUBLICATIONS

English translation of Written Opinion dated May 14, 2015 in PCT/EP2014/071301.

* cited by examiner

ONE-PIECE, HOLLOW MICROMECHANICAL PART WITH SEVERAL FUNCTIONAL LEVELS FORMED OF A SYNTHETIC CARBON ALLOTROPE BASED MATERIAL

CROSS-REFERENCE TO RELATED APPLICATIONS

The present application is a divisional of and claims the benefit of priority under 35 U.S.C. § 120 from U.S. application Ser. No. 15/030,710, filed Apr. 20, 2016, which is a National Phase Application of International Patent Application No. PCT/EP2014/071301, filed on Oct. 6, 2014, which claims priority to European Patent Application No. 13192133.0, filed on Nov. 8, 2013, the entire disclosures of the above patent applications are hereby incorporated by reference.

FIELD OF THE INVENTION

The invention relates to a method for fabrication of a micromechanical part and more specifically to such a one-piece part formed of a synthetic carbon allotrope based material and comprising several functional levels.

BACKGROUND OF THE INVENTION

WO Patent 2012/104110 discloses the fabrication of a part made of diamond with a single level formed from a silicon substrate. Such a part may, however, be difficult to join to a pivot or to another part given that diamond cannot be driven in.

SUMMARY OF THE INVENTION

It is an object of the present invention to overcome all or part of the aforementioned drawbacks, by proposing a method for fabrication of complex one-piece micromechanical parts in three dimensions using a minimum amount of material.

To this end, the invention relates to a method for fabrication of a one-piece micromechanical part formed of a synthetic carbon allotrope based material, the method comprising the following steps:

a) forming a substrate comprising, on at least three levels, a negative cavity for said micromechanical part to be fabricated;

b) covering said negative cavity of the substrate with a layer of said synthetic carbon allotrope based material in a thickness less than the depth of each of said at least three levels of said cavity;

c) removing the substrate to release the micromechanical part formed in said negative cavity;

wherein step a) comprises the following phases:

i) forming a first wafer comprising at least a first pattern etched through the wafer;

ii) forming a second wafer comprising at least a second pattern etched through the wafer;

iii) forming a third wafer that has no through pattern;

iv) bonding said first, second and third wafers in order to form the substrate comprising a negative cavity on at least three levels.

It is therefore clear that the method allows for the fabrication of a one-piece three dimensional micromechanical part, i.e. with several functional layers, from only a synthetic carbon allotrope based material, i.e. with no discontinuity of material, which includes a "skin" of material, i.e. a narrow thickness of material. Moreover, additionally, the external surface of the micromechanical part takes on the favourable roughness of the used substrate.

The method according to the invention thus advantageously makes it possible to very substantially reduce the cost of the synthetic carbon allotrope based material by depositing only the amount of material needed for the final coating, without requiring a finishing operation, and also improves the roughness of the external surface of the micromechanical part and optimise its tribological properties.

According to other advantageous features of the invention:

in phase ii), the second wafer is formed by including a second pattern etched through the wafer and a third pattern that is not etched through, communicating with said second pattern;

during phase iii), the third wafer is formed by including a pattern that is not etched through;

according to a first alternative, step b) comprises the following phases: b1): forming a sacrificial layer on one portion of the substrate; b2): depositing particles on the substrate intended to form nucleation sites; b3): removing the sacrificial layer to selectively leave one portion of the substrate free of any particles; b4): chemical vapour phase deposition of a synthetic carbon allotrope based material layer, so that it is deposited only where particles remain;

according to a second alternative, step b) comprises the following phases: b5): forming a sacrificial layer on one portion of the substrate; b6): chemical vapour phase deposition of a synthetic carbon allotrope based material layer on the substrate and b7): removing the sacrificial layer to leave one portion of the substrate selectively free of any deposition;

at least one of said at least three levels of the negative cavity includes a wall forming a toothing;

the synthetic carbon allotrope based material is in crystallized form or in amorphous form;

after step b), the method comprises step d): removing from the substrate a thickness greater than that of the layer deposited in step b) in order to leave a thickness of said layer confined within said negative cavity;

before step c), the method comprises step e): filling the cavity coated with the synthetic carbon allotrope based material with a second material so as to obtain, after step c), a micromechanical part made of a synthetic carbon allotrope based material which is strengthened by and/or decorated with a second material;

in step e), the second material is formed projecting from said cavity to form an additional functional level of the micromechanical part;

the second material comprises a metal or metal alloy.

Further, the invention relates to a micromechanical part in one-piece obtained from the method according to any of the preceding variants, wherein the micromechanical part in one piece is hollow, includes several functional levels made of a synthetic carbon allotrope based material in a layer of a thickness of between 0.2 µm and 20 µm, the micromechanical part in one piece having a height greater than the thickness of the layer of synthetic carbon allotrope based material.

The micromechanical part made of a synthetic carbon allotrope based material is advantageously in one-piece, i.e. with no discontinuity of material, hollow, i.e. formed by a shell of material to limit the amount of material used, and its volume forms several perfectly referenced functional levels able to directly include a pivot axis.

It is understood that this makes it possible to reduce the scrap rate caused by referencing errors but also to improve the external surface roughness and optimise its tribological properties.

According to other advantageous features of the invention:

- the external surface of the micromechanical part includes at least one toothing;
- the hollow of the micromechanical part in one piece is at least partially filled with a second material to obtain a micromechanical part in one piece formed of the synthetic carbon allotrope based material strengthened by and/or decorated with a second material;
- said second material is formed projecting from said height of the external surface in order to form an additional functional element of the micromechanical part in one piece.
- The second material includes a metal or metal alloy.

Finally, the invention relates to a timepiece, wherein the timepiece includes a micromechanical part in one piece according to any of the preceding variants, the micromechanical part in one piece forming all or part of a crystal, a case, a push-piece, a crown, a bracelet, a watchband, a dial, a display member, a balance spring, a balance wheel, a pallets, a bridge, a main plate, a wheel set or an escape wheel.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

The invention relates to a method for fabrication of a one-piece micromechanical part with several functional levels formed of a synthetic carbon allotrope based material in crystalline form, such as diamond or one or more layers of graphene, or in amorphous form, such as diamond-like-carbon (DLC).

Of course, advantageously according to the invention, other types of materials, which can be deposited in layers and which have tribological advantages, may be used as an alternative to a synthetic carbon allotrope based material. This alternative material may be, for example, a silicon based compound, i.e. for example silicon nitride, silicon oxide or silicon carbide.

This micromechanical part was devised for applications within the field of horology. However, other domains may very well be envisaged, such as, in particular, aeronautics, jewelry or the automobile industry.

In the field of horology, this micromechanical part may, for example, form part of the exterior of a watch, or part of the timepiece movement. The micromechanical part may thus form all or part of a crystal, a case, a push-piece, a crown, a bracelet or watchband, a dial, a display member, a balance spring, a balance wheel, a pallets, a bridge, a main plate, a wheel set or an escape wheel.

A first embodiment of the method for fabrication of such a micromechanical part is presented in FIGS. 1 to 8 and 17 to 18. In a step a, the method consists in forming, in a substrate 1, 101 on at least two levels $N_1$, $N_2$, $N_x$, a negative cavity 3,103 for the future micromechanical part. There is a large variety of possible substrates 1, 101. Preferably, the material of substrate 1, 101 is selected for its very low roughness, i.e. the natural feature of having a smooth surface, but also for its resistance to the aggressiveness of the deposition steps.

By way of example, FIGS. 1, 2, 17 and 18 show step a formed from a silicon substrate 1, 101, for which it is possible to obtain a very low roughness, i.e. an arithmetic mean deviation $R_a$ substantially less than 10 nm.

Figure 1:
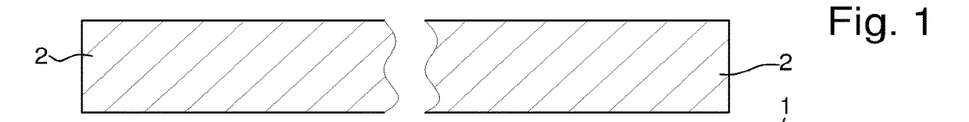
FIGS. 1 to 8 are representations of successive steps of a fabrication method according to a first embodiment.
Figure 2:
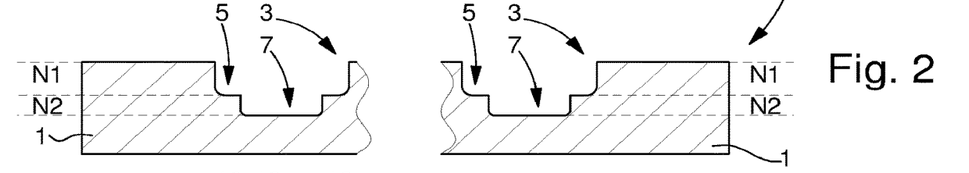

Thus, in a first alternative of step a illustrated in FIGS. 1 and 2, substrate 1 including a cavity 3 on at least two levels $N_1$, $N_2$, $N_x$, is formed from a single wafer 2.

The first alternative of step a therefore uses several masks in order to obtain several etching patterns with different depths. Thus, a first phase a1 of step a is intended to form, on substrate 1, a first mask including a first pattern. A second phase a2 is intended to form, on the surface of said substrate and of the first mask, a second mask including a second pattern that is smaller than the first pattern of said first mask in order to etch two distinct patterns in the substrate.

The first alternative of step a continues with the third phase a3 of performing an anisotropic etch (such as, for example, deep reactive ion etching or "DRIE") to etch the second pattern in a first thickness of the substrate, then a fourth phase a4 intended to remove the second mask. In a variant, the thickness and material of the second mask may be selected so that the second mask is etched at the same time as the substrate so as to combine the above phases a3 and a4 in one phase. It is understood that the pattern that will be etched on level $N_2$ is, for the moment, only etched on level $N_1$.

The first alternative of step a continues with the fifth phase a5, consisting in performing a second anisotropic etch to continue the etch of the second pattern, already performed in level $N_1$, in level $N_2$ and to start the etch of the first pattern in level $N_1$ of substrate 1, i.e. to expand the etch of the second pattern towards the first pattern in level $N_1$. The first alternative of step a ends, in the case of an etch on two levels, with a last phase a6 intended to remove the first mask in order to form substrate 1 including a negative cavity 3 on at least two levels $N_1$, $N_2$.

In a variant, the substrate could be an SOI, i.e. it could include two silicon layers connected by a layer of silicon dioxide. One of the silicon layers could then undergo step a and the bottom of negative cavity 3 on at least two levels $N_1$, $N_2$ could be formed by the silicon dioxide layer in a more precise manner. Indeed, since the etch in step a is very selective, it cannot etch the silicon dioxide layer. It is understood that the bottom of the cavity will be easier to control.

Figure 17:
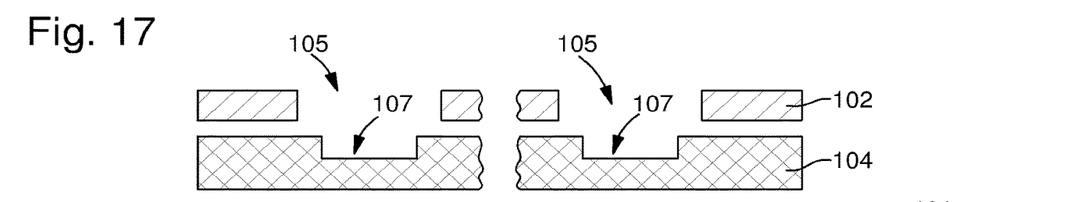
FIGS. 17 and 18 are representations of successive steps of a fabrication method according to an alternative of FIGS. 1 and 2 of the first embodiment.
Figure 18:
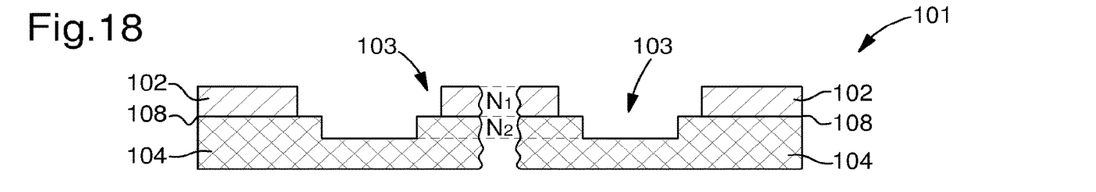

In a second alternative of step a illustrated in FIGS. 17 and 18, substrate 101 including a cavity 103 on at least two levels $N_1$, $N_2$, $N_x$, is formed in as many wafers 102, 104 as there are levels required. This second alternative is preferred in the case where more than two levels are desired, as explained below in the fourth and fifth embodiments.

The second alternative of step a thus uses several wafers directly etched with the pattern required for the associated level $N_1$, $N_2$, $N_x$. Thus, in the second alternative of step a on two levels $N_1$, $N_2$, a first phase a7 is intended to form a first wafer 102 including at least a first pattern 105 that is etched through, and a second phase a8 of forming a second wafer 104 including at least a second pattern 107 that is not etched through. In a last phase a9, step a according to the second alternative ends with bonding the first 102 and second 104 wafers to form substrate 101 including a negative cavity 103 on at least two levels $N_1$, $N_2$, respectively formed of first pattern 105 and second pattern 107. Preferably, bonding phase a9 is achieved by fusion bonding and forms a layer 108.

After one of the two step a alternatives, the first embodiment continues with step b, in which negative cavity 3, 103 of substrate 1, 101 is coated with a layer 15, 17 of synthetic carbon allotrope based material of smaller thickness $e_1$ than the depth of each of said at least two levels $N_1$, $N_2$, $N_x$, of said cavity 3, 103.

Advantageously according to the invention, step b may also have two alternatives depending on the geometric complexity required for layer 15, 17 of the synthetic carbon allotrope based material.

Figure 3:
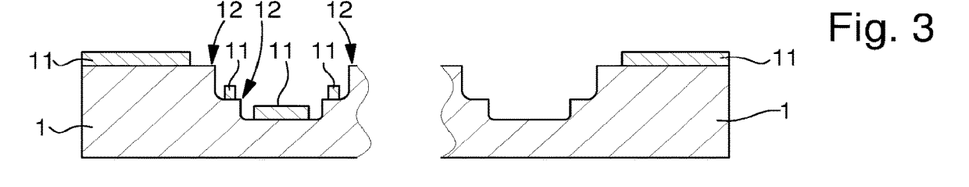

In a first alternative of second step b illustrated in the left part of FIG. 3, the first phase b1 is intended to form a sacrificial layer 11 on one portion of substrate 1. It is understood that substrate 1 therefore has uncoated areas 12. Preferably, step b1 is achieved by photolithography with a positive or negative photosensitive resin. In a variant, screen printing, or pad printing, may be performed by depositing a thickness of the material intended to form the sacrificial layer in a particular pattern.

Figure 4:
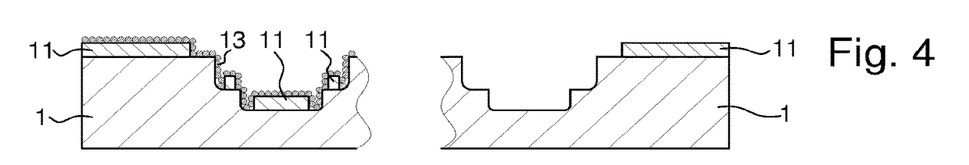

As illustrated in FIG. 4, the first alternative of the second step b continues with second phase b2 of depositing particles 13 on substrate 1 intended to form nucleation sites for the future deposition. Preferably, the second phase b2 includes an initial stage of coating substrate 1 using a colloidal solution containing said particles. The coating can thus be obtained by at least partially immersing substrate 1 in a solution in which the particles are purposely made to move in the solvent so as to obtain the most homogeneous possible distribution in the solution. By way of example, the mobility of the particles in the solvent may be achieved by ultrasonic agitation. Finally, the solvent may consist of alcohol or water, although it is not limited thereto.

Particles 13 are used as nucleation sites. In this regard, the particles may be impurities with respect to the material of the subsequent deposition, just as they may be of the same nature as the material of the subsequent deposition. Preferably, the diameter of the particles is comprised between several nanometres and several tens of nanometres.

Phase b2 continues with a second stage of removing the solvent from the solution to form particles 13 on substrate 1. This second stage may be achieved for example by evaporating the solvent.

Figure 5:
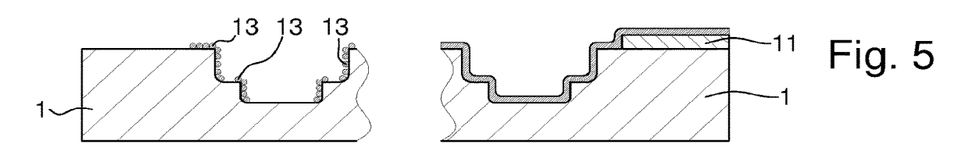

Second phase b2 is followed by a third phase b3 illustrated in FIG. 5, of removing sacrificial layer 11 from substrate 1 so as to leave one portion of substrate 1 selectively free of any particles 13. It is thus clear that the portions including particles 13 are the areas where there is no sacrificial layer 11. Phase b3 may, by way of non-limiting example, be obtained by dissolution or by selective chemical etching of sacrificial layer 11.

Figure 6:
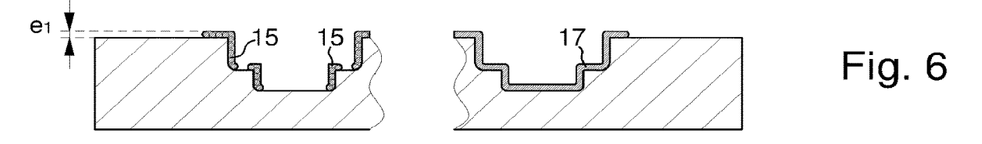

A fourth phase b4 of the first alternative of second step b is intended to deposit a material 15 by chemical vapour phase deposition so that it is deposited exclusively where particles 13 remain. At the end of step b, as illustrated in FIG. 6, there is obtained a substrate 1, formed directly with the desired partial layer of material 15. It is understood that the first alternative of second step b thus allows a partially pierced micromechanical part to be formed.

In a second alternative of second step b illustrated in the right part of FIG. 5, phase b6 is limited to the chemical vapour phase deposition of a material with no selectivity, i.e. over the entire upper surface. In this regard, an earlier phase b5 illustrated in the right portion of FIG. 3 (similar to b1 of the first alternative) and a later phase b7 illustrated in the right portion of FIG. 6 (similar to phase b3 of the first alternative) may be implemented in order to limit the presence of layer 17 notably on the upper surface of substrate 1. At the end of step b, as illustrated in FIG. 6, there is obtained a substrate 1, directly formed with the desired layer of material 17. It is understood that the second alternative of second step b thus allows a micromechanical part to be formed with no openings in the external surface of the micromechanical part.

Figure 7:
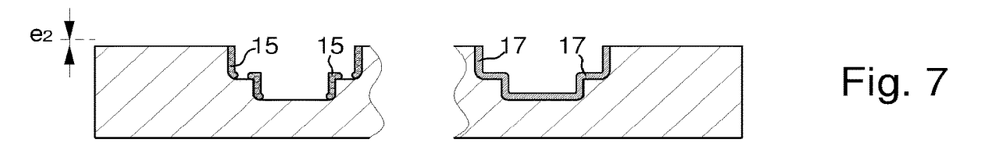

Whichever alternative is used for second step b, the method according to the invention, as illustrated in FIG. 7, may include an optional third step d. Step d is intended to remove one portion of substrate 1 coated with layer 15, 17 in order to leave a thickness of layer 15, 17 contained within negative cavity 3 with at least two levels. Preferably according to the invention, a greater thickness $e_2$ is removed from substrate 1 than thickness $e_1$ of layer 15, 17 as illustrated in FIG. 7. It is thus understood that layer 15, 17 is definitely no longer present except in cavity 3 on at least two levels of substrate 1.

Further, it is also seen that step d may be equivalent to phases b1, b5 and b3, b7 to confine layer 15, 17 within cavity 3. Indeed, the same result can be obtained simply by forming a sacrificial layer 11 over the entire substrate 1, with the exception of cavity 3.

In a last step c of the first embodiment, the method consists in removing substrate 1 so as to release the micromechanical part with several functional levels $F_1$, $F_2$, $F_x$, formed at least partially in cavity 3. Consequently, in the above example in which substrate 1 is made of silicon, step d may consist of a selective etch of the silicon. This may, for example, be obtained by a chemical etch using a bath comprising tetramethylammonium hydroxide (known by the abbreviations TMAH and TMAOH). In a variant, a potassium hydroxide chemical etch may also be envisaged (known by the abbreviation KOH).

Figure 8:
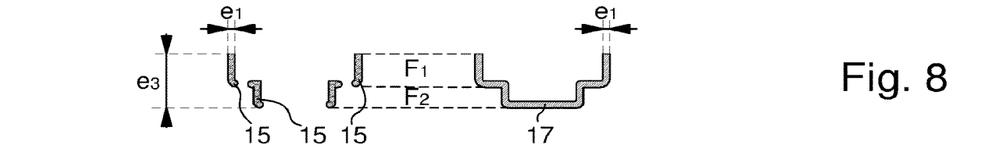

In the two examples illustrated in FIG. 8, there is obtained a micromechanical part, formed exclusively of layer 15, 17, the geometry of which at least partially matches cavity 3, i.e. completely or partially. Advantageously, the external surface, i.e. the surface which was directly in contact with substrate 1, has a very low roughness, i.e. comparable to that of substrate 1, and is preferably used as the mechanical contact surface.

Finally, for a height $e_3$ of the micromechanical part with two levels comprised between 20 μm and 1000 μm, a thickness $e_1$ of layer 15, 17 of only 0.2 μm to 20 μm is deposited. The savings in material and production costs due to the shortened time of deposition step b are thus immediately clear.

Therefore, regardless of the complexity of the micromechanical part, the method is not more difficult to implement. By way of example, there is no increased difficulty in forming a toothing on a wall of cavity 3, which will form a matching toothing on the micromechanical part.

Figure 9:
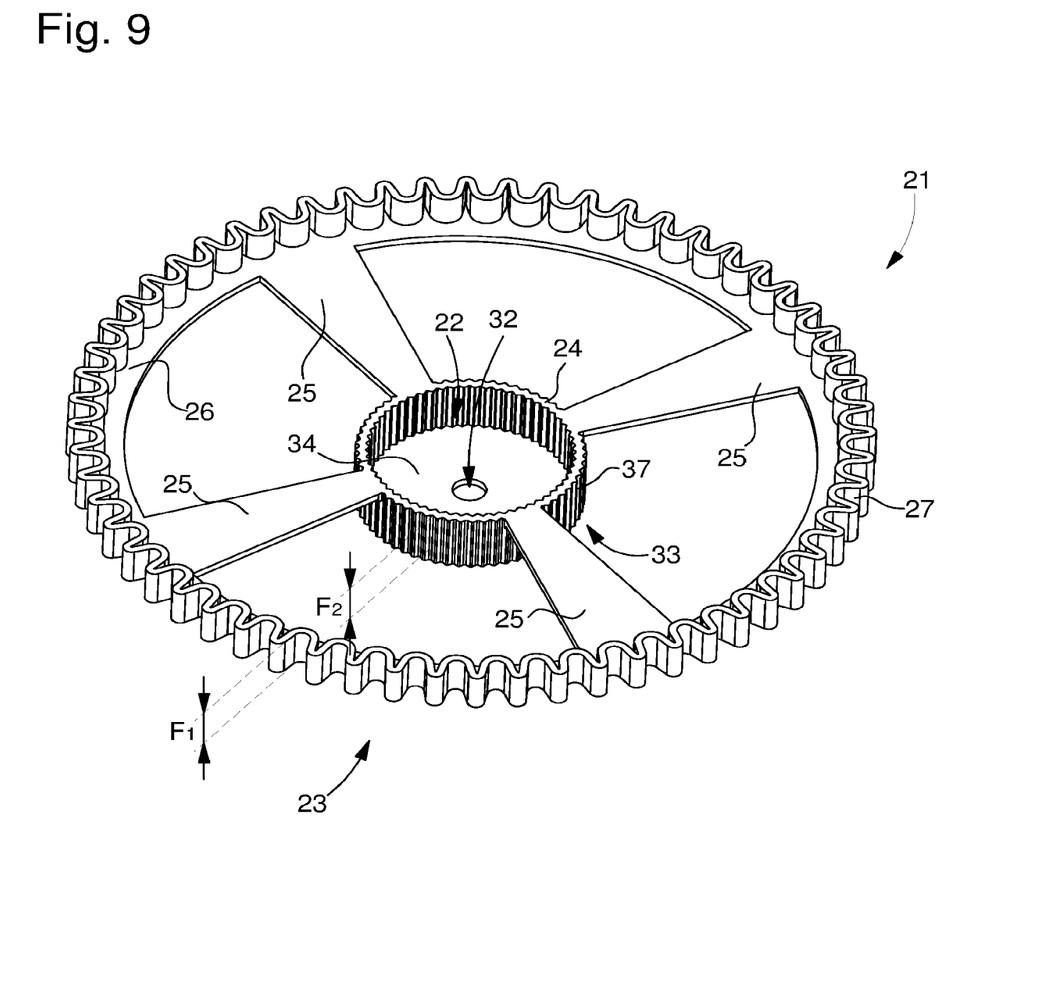
FIG. 9 is a representation of an example of a micromechanical part obtained according to a first embodiment.

By way of non-limiting example, in which the first alternative of second step b is applied, it is possible to obtain a micromechanical part 21 as shown in FIG. 9. Micromechanical part 21 includes a first functional level $F_1$ formed of a first substantially discoid plate 23 whose centre includes a hole 22 communicating with a second functional level $F_2$. Moreover, coaxially to hole 22, first functional level F1 there extends a hub 24 connecting several arms 25 to the felloe 26. A toothing 27 projects orthogonally from the periphery of the felloe. FIG. 9 thus shows that that the thickness of plate 23, i.e. of hub 24, of arms 25, of felloe 26, and of toothing 27 is formed by the thickness $e_1$ of layer 15 deposited in step b of the method.

Further, micromechanical part 21 includes a second functional level $F_2$ formed of a second substantially discoid plate 33 whose centre includes a hole 32 for cooperation with an arbor. Further, coaxially to hole 32, second functional level $F_2$ there extends a hub 34 from the periphery of which there projects orthogonally a toothing 37 joining hub 24 of first functional level $F_1$. FIG. 9 thus shows that that the thickness of toothing 33, i.e. of hub 34, and of toothing 37 is formed by the thickness $e_1$ of layer 15 deposited in step b of the method.

Advantageously according to the invention, the material is deposited selectively by depositing only the amount of material necessary for the final coating, with no requirement for any subsequent finishing operation. This results in a reduction in the scrap rate which was due to the operation of removing material (damage to substrate 1, slivers on deposition 15, 17, etc.). This also reduces production costs, due to the shortening of deposition step b, the use of less material 15, 17 and the absence of any mechanical lapping operation on the contact areas provided.

Figure 10:
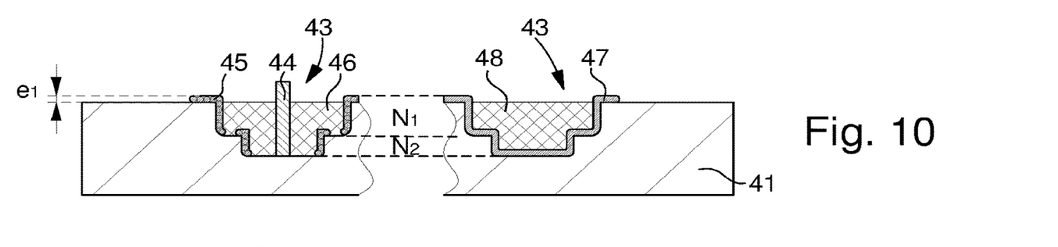
FIGS. 10 to 12 are representations of successive steps of a fabrication method according to a second embodiment.
Figure 11:
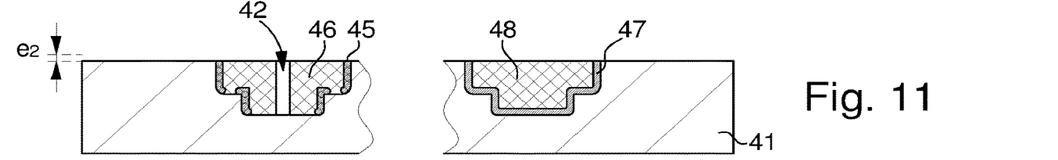
Figure 12:
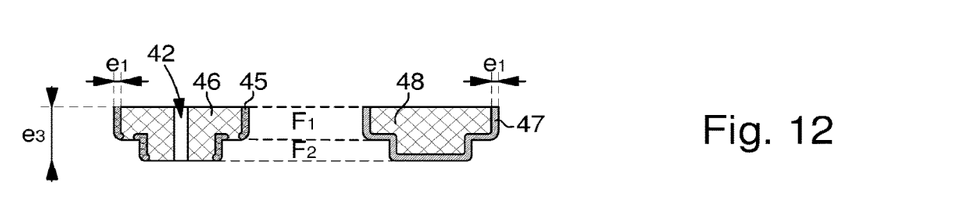

A second embodiment is shown in FIGS. 10 to 12. Steps a and b according to the second embodiment are identical to the first embodiment and consist in forming, in a substrate 41, a negative cavity 43 on at least two levels $N_1$, $N_2$, $N_x$, which is at least partially coated with a layer 45, 47 of synthetic carbon allotrope based material forming the future micromechanical part, enjoying the same alternatives and advantages as the first embodiment.

However, as illustrated in FIG. 10, a step e is performed prior to step c, which consists in filling cavity 3, coated with a synthetic carbon allotrope based material 45, 47, with a second material so that, after step c, there is obtained a micromechanical part formed of a synthetic carbon allotrope based material that is strengthened by and/or decorated with a second material 46, 48.

According to a first alternative shown in the right portion of FIG. 10, the second material 48 is immediately deposited to completely fill the rest of cavity 3 which was coated with layer 47 in step b.

According to a second alternative shown in the left portion of FIG. 10, a phase $e_{-1}$, prior to step e and intended to form a sacrificial volume and a phase $e_{+1}$, subsequent to step e and intended to remove the sacrificial volume, are implemented to limit the presence of the second material 46 in step e, In the example illustrated in FIG. 10, the earlier phase $e_{-1}$ allows a rod 44 to be formed, so that, in the subsequent phase $e_{+1}$, a hole 42 devoid of second material 46 is formed, as illustrated in FIG. 11. In a non-limiting manner, rod 44 may be formed by photolithography with a negative or positive photosensitive resin and then removed by dissolution or selective etching. In a variant, rod 44 may also be made in step a, i.e. rod 44 would be formed by a portion of substrate 41.

Preferably, step e of filling the hollows is achieved by electroplating or hot working. Electroplating is easier to perform if the substrate is made of a conductive material such as strongly doped silicon. The second material is preferably a metal or metal alloy which may or may not be amorphous. However, alternatively, there is nothing to prevent the type of deposition and/or nature of the deposited material from being changed. Likewise, electroplating may be facilitated by making synthetic carbon allotrope based material 45, 47 electrically conductive, i.e., for example, by depositing boron doped diamond in step b to make it electrically conductive.

Consequently, in this second embodiment, optional step d may be used not only to limit the thickness of layer 45, 47 in negative cavity 43, 47 on several levels $N_1$, $N_2$, $N_x$, but also to make the deposition of the second material 46, 48 flat with respect to said limited portion.

Thus, possibly after optional step d and after step c, which are similar to the first embodiment, illustrated in FIG. 12, there is obtained a micromechanical part with several functional levels $F_1$, $F_2$, $F_x$, made of a first material 45, 47 with the same variants and advantages as the first embodiment, wherein first material 45, 47 is also strengthened by and/or decorated with a second material 46, 48.

According to another advantage of the invention, it is henceforth possible to coat parts having several functional layers $F_1$, $F_2$, $F_x$ with thin layers, which was impossible to fabricate previously due to the particular conditions required for thin layer deposition, such as, for example, the pressure, temperature or compounds used. In a non-limiting manner and advantageously according to the invention, it is thus possible to form a mainly metallic part with several functional levels $F_1$, $F_2$, $F_x$ from the second material 46, 48, which is coated with a layer of a synthetic carbon allotrope based material from layer 45, 47, whereas currently, it remains difficult, to the Applicant's knowledge, to coat a metallic part with diamond.

Figure 13:
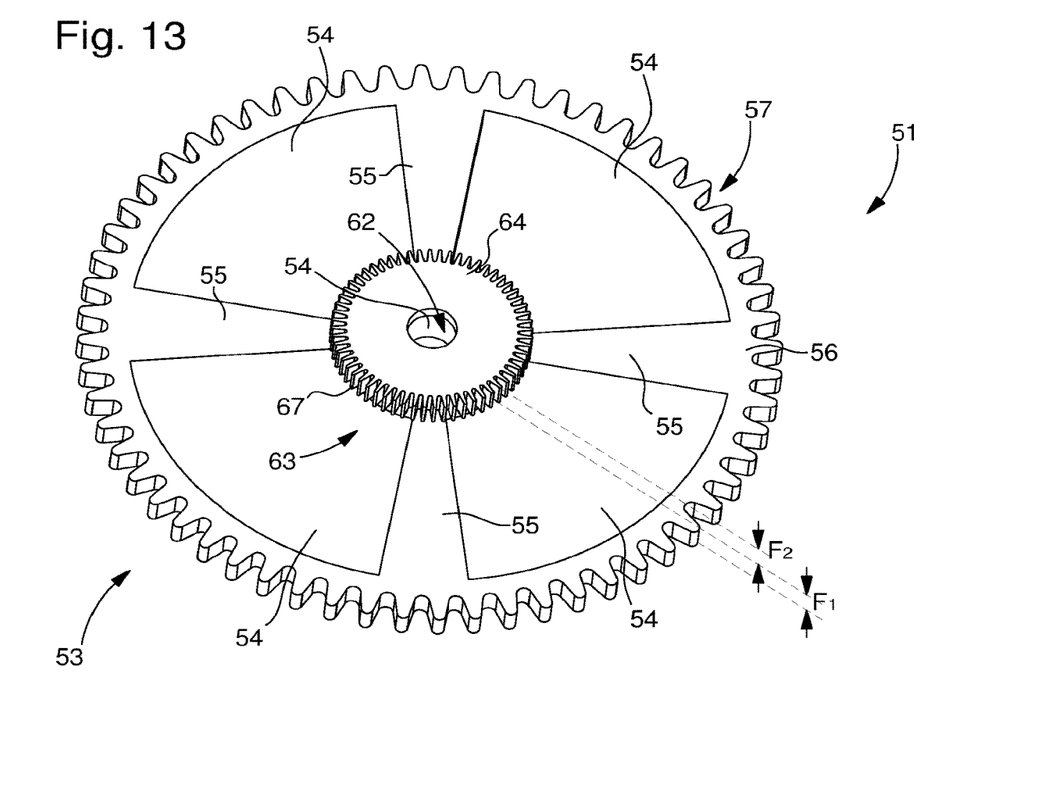
FIG. 13 is a representation of an example of a micromechanical part obtained according to a second embodiment.

It is also clear that it is possible to obtain a micromechanical part with the same complexities as the first embodiment. By way of non-limiting example, FIG. 13 shows a micromechanical part 51 which can be produced according to the second embodiment. Micromechanical part 51 includes a first functional level $F_1$ formed of a first substantially discoid plate 53 whose centre includes a hole communicating with a second functional level $F_2$. Moreover, coaxially to the hole, first functional level F1 there extends a hub connecting several arms 55 to the felloe 56. A toothing 57 projects orthogonally from the periphery of the felloe. Finally, the rest of first functional level $F_1$ is filled with the second material 54, with the exception of the empty space formed by through hole 62.

Further, micromechanical part 51 includes a second functional level $F_2$ formed of a second substantially discoid plate 63 whose centre includes a hole 62 for cooperation with an arbor. Further, coaxially to hole 62, second functional level $F_2$, there extends a hub 64 from the periphery of which there projects orthogonally a toothing 67 joining the hub of first functional level $F_1$. Finally, the rest of the second functional level $F_2$ is filled with second material 54, with the exception of the empty space formed by through hole 62.

In a variant, part 51 could advantageously include strengthening structures for portions 55. Typically, these structures could for example strengthen the bending of portions 55. Various forms of structures, such as radial or ribbed structures, could provide increased stiffness and be formed in the substrate by means of the first mask.

Figure 14:
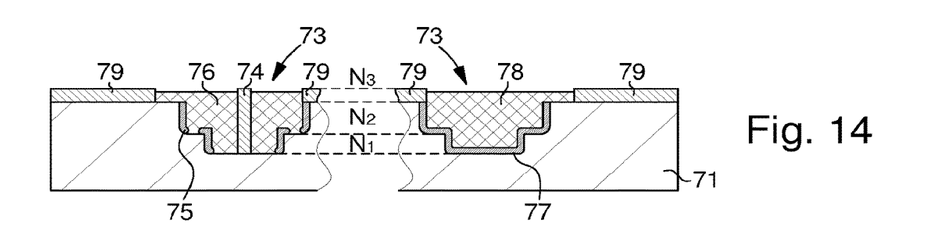
FIGS. 14 and 15 are representations of successive steps of a fabrication method according to a third embodiment.
Figure 15:
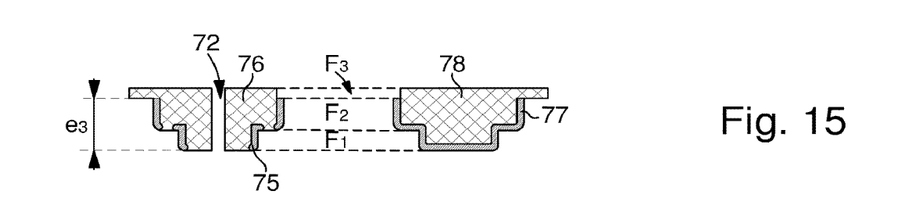

FIGS. 14 to 15 show a third embodiment that is similar to the second embodiment. With respect to the first and second embodiments, steps a to c remain identical. However, step e of the second embodiment is modified.

Thus, in the third embodiment after steps a, b and possibly step d, the method includes a prior phase $e_{-1}$, similar to that of the second embodiment, of forming a sacrificial volume 79 intended to create a level above level $N_3$ exclusively for the second material 76, 78 and, possibly, a rod 74 in order to form a hole 72, as in the second embodiment.

As illustrated in FIG. 14, in step e, the second material 76, 78 is formed projecting from said cavity so as to form an additional functional level of the micromechanical part. Thus, after a subsequent phase $e_{+1}$, similar to that of the second embodiment, of removing sacrificial volume 79 and, possibly rod 74, and step c similar to the first and second embodiments, there is obtained, as illustrated in FIG. 15, a micromechanical part made of a first material 75, 77 strengthened by and/or decorated with a second material 76, 78 enjoying the same variants and advantages as the first $F_1$ and second $F_2$ functional levels of the second embodiment with the addition of a third level $F_3$, formed exclusively with the second material 76, 78 projecting from thickness $e_3$ to form an additional functional level $F_3$ of the micromechanical part.

Figure 16:
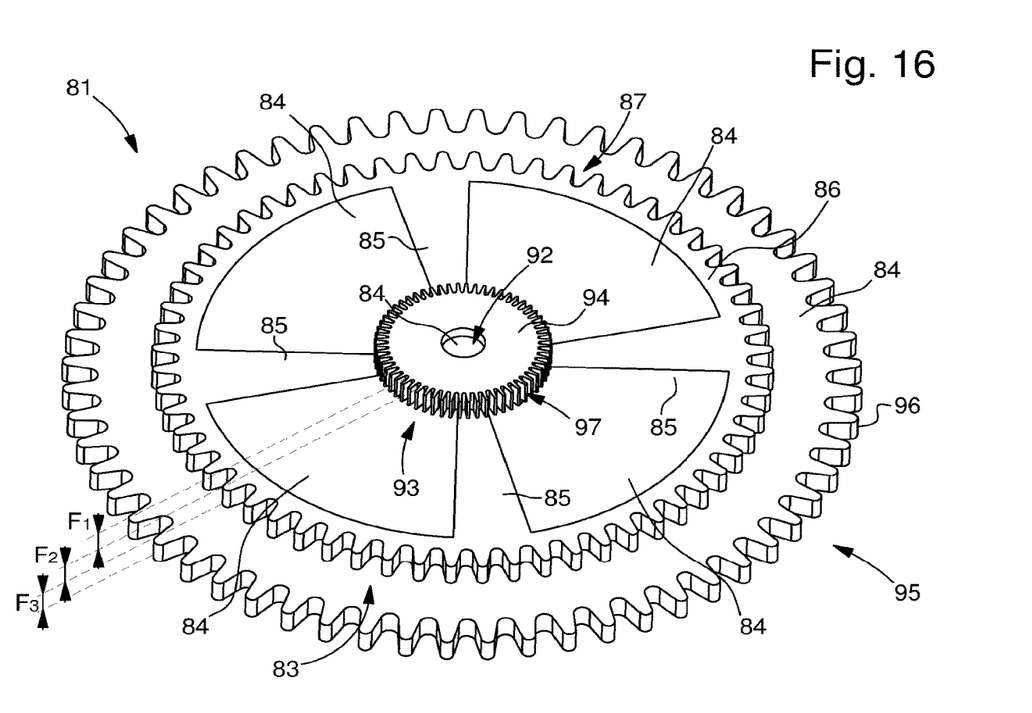
FIG. 16 is a representation of an example of a micromechanical part obtained according to a third embodiment.

It is also clear that it is possible to obtain a micromechanical part with the same complexities as in the first two embodiments. By way of non-limiting example, FIG. 16 shows a micromechanical part 81, which can be produced according to the third embodiment. Micromechanical part 81 includes a first functional level $F_1$ formed of a first substantially discoid plate 93 whose centre includes a hole 92 for cooperation with an arbor. Further, coaxially to hole 92, first functional level $F_1$, there extends a hub 94 from the periphery of which there projects orthogonally a toothing 97 joining second functional level $F_2$. Finally, the rest of first functional level $F_1$ is filled with second material 84, with the exception of the empty space formed by through hole 92.

Micromechanical part 81 includes a second functional level $F_2$ formed of a second substantially discoid plate 83 whose centre includes a hole communicating with first functional level $F_1$. Moreover, coaxially to hole 2, second functional level $F_2$ there extends a hub connecting several arms 85 to the felloe 86. A toothing 87 projects orthogonally from the periphery of the felloe. Finally, the rest of the second functional level $F_2$ is filled with second material 84, with the exception of the empty space formed by through hole 92.

Advantageously according to the third embodiment, micromechanical part 81 includes a third functional level $F_3$ formed of a substantially discoid third plate 95 whose centre includes a hole communicating with the second functional level $F_2$. The third functional level $F_3$ is formed exclusively of second material 84, with the exception of the empty space formed by through hole 92, and includes a peripheral toothing 96.

The three embodiments of FIGS. 1 to 16 of the method therefore advantageously very substantially reduce the cost of the material 15, 17, 45, 47, 75, 77 made of a synthetic carbon allotrope based material by only depositing the amount of material necessary for the final coating, without requiring a finishing operation. The three embodiments of FIGS. 1 to 16 also improve the external surface roughness of the micromechanical part 21, 51, 81 and improve its tribological properties. The micromechanical part 21, 51, 81 obtained is advantageously one-piece, i.e. with no discontinuity of material, hollow or filled, i.e. formed by a shell of material 15, 17, 45, 47, 75, 77 to limit the amount of synthetic carbon allotrope based material and, possibly, filled with a second material 46, 48, 54, 76, 78, 84, whose volume forms several perfectly referenced functional levels $F_1$, $F_2$, $F_3$, $F_x$, capable of directly incorporating a pivot axis formed by the second material.

It is understood, however, that the three embodiments of FIGS. 1 to 16 are capable of being combined with each other and/or of modifications depending on the desired applications.

By way of non-limiting example, fourth and fifth embodiments are shown in FIGS. 19 to 26 by combining and modifying alternatives of the first embodiment. It is understood that these fourth and fifth embodiments are also capable of being combined with the first three embodiments of FIGS. 1 to 16.

The fourth and fifth embodiments according to the invention both use a modification of the second alternative of step a illustrated in FIGS. 17 and 18. In the fourth and fifth embodiments, a substrate, including a cavity on at least three levels $N_1$, $N_2$, $N_x$, is formed from three wafers. Thus, the fourth embodiment illustrated in FIGS. 19 to 22 uses two wafers etched in a particular pattern forming one or more associated levels $N_1$, $N_2$, $N_x$.

According to a variant mentioned above, one of the wafers could also be replaced by an SOI, so that the bottom of the cavity is formed by the silicon dioxide layer.

Figure 19:
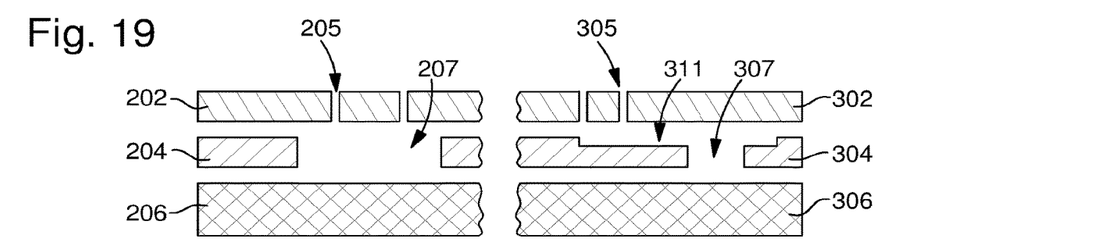
FIGS. 19 to 22 are representations of successive steps of a fabrication method according to a fourth embodiment of the invention.
Figure 20:
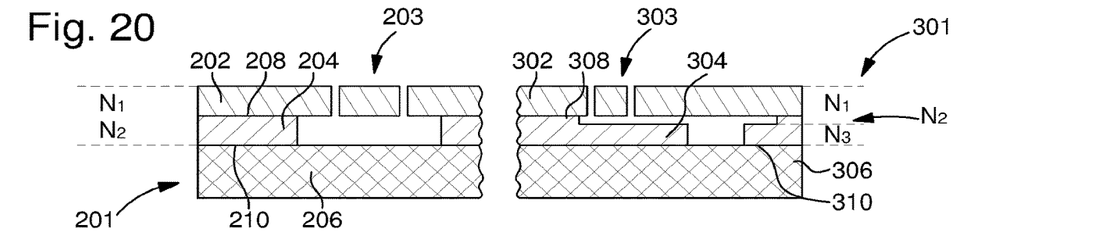
Figure 21:
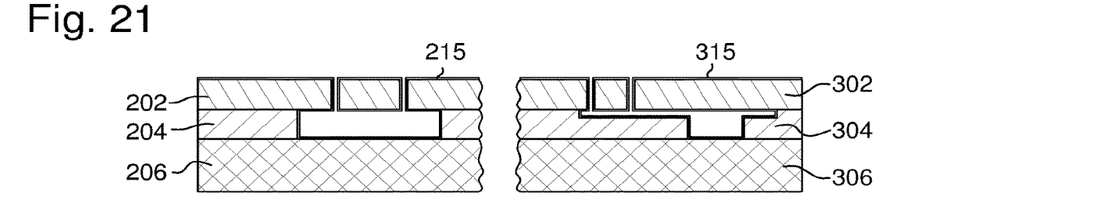

According to a first alternative of step a of the fourth embodiment illustrated to the left of FIGS. 19 and 20, two wafers are etched in the desired pattern for the associated level $N_1$, $N_2$ and a third wafer 206 is left unetched, i.e. with no through pattern. Thus, in the first alternative of step a, a first phase a10 is intended to form a first wafer 202 including a first pattern 205 etched through, a second phase a11 intended to form a second wafer 204 including a second pattern 207 etched through, and a third phase a12 of forming a third wafer 206 without an etched pattern. In a last phase a13, step a of the first alternative of the fourth embodiment finishes by bonding wafers 202, 204, 206 with the aid of layers 208, 210 formed by fusion bonding, to form substrate 201 including a negative cavity 203 on at least three levels $N_1$, $N_2$, respectively formed of first pattern 205 and second pattern 207.

After step a, the first alternative of the fourth embodiment continues with step b, in which negative cavity 203 of substrate 201 is coated with a layer 215 of synthetic carbon allotrope based material of smaller thickness $e_1$ than the depth of each of said at least three levels $N_1$, $N_2$ of said cavity 203.

The first alternative of the fourth embodiment of the method of the invention may also include an optional third step d or similar phases to phases b1, b5 and b3, b7 to confine layer 215 within cavity 203. Likewise, another optional step e may be performed before step c, which consists in filling cavity 203, coated with synthetic carbon allotrope based material 215, with a second material so as to obtain, after step c, a micromechanical part made of a synthetic carbon allotrope based material 215 which is strengthened by and/or decorated with a second material, as in the aforecited second and third embodiments.

In a last step c of the first alternative of the fourth embodiment, the method consists in removing substrate 201, so as to release the micromechanical part with several functional levels $F_1$, $F_2$, at least partially formed in cavity 203, with the same variants and advantages as in the three first embodiments.

Figure 22:
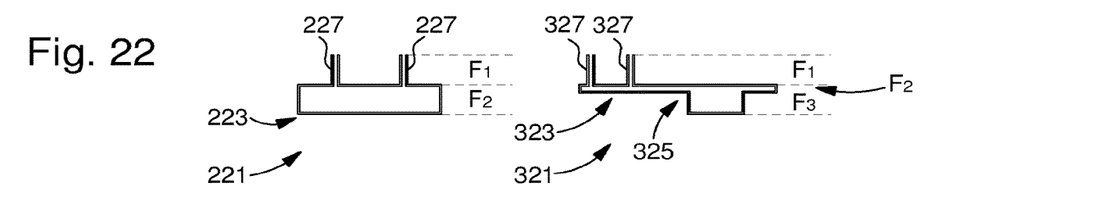

In the first alternative illustrated to the left of FIG. 22, there is obtained a micromechanical part, formed exclusively of layer 215, the geometry of which at least partially matches cavity 203. Advantageously, the external surface, i.e. the surface which was directly in contact with substrate 201, has a very good roughness, i.e. comparable to that of substrate 201, and is preferably used as the mechanical contact surface.

In the example illustrated to the left of FIG. 22, it is possible to envisage forming a watch applique 221, i.e. a portion of a display member. There is therefore obtained a micromechanical part 221 including a first functional level $F_1$ formed of feet 227 intended to cooperate with a timepiece dial, and a second functional level $F_2$ formed of a hollow main body 223 forming the visible part of applique 221. FIG. 22 thus shows that the thickness of main body 223 and of feet 227 is formed by the thickness $e_1$ of layer 215 deposited in step b of the method.

According to a second alternative of step a of the fourth embodiment illustrated to the right of FIGS. 19 and 20, two wafers 302, 304 are etched in a particular pattern required for one or more levels $N_1$, $N_2$, $N_3$, and a third wafer 306 is left unetched, i.e. with no through pattern. Thus, in the second alternative of step a, a first phase a14 is intended to form a first wafer 302 including a first pattern 305 etched through, a second phase a15 intended to form a second wafer 304 including a second pattern 307 etched through and a third etched, non-through pattern 311 communicating with second pattern 307. Step a also includes a third phase a16 consisting of forming a third wafer 306 with no etched pattern. In a last phase a17, step a of the second alternative of the fourth embodiment finishes by bonding wafers 302, 304, 306 with the aid of layers 308, 310 formed by fusion bonding, to form substrate 301 including a negative cavity 303 on at least three levels $N_1$, $N_2$, $N_3$, respectively formed of patterns 305, 311, 307.

After step a, the second alternative of the fourth embodiment continues with step b, in which negative cavity 303 of substrate 301 is coated with a layer 315 of synthetic carbon allotrope based material of smaller thickness $e_1$ than the depth of each of said three levels $N_1$, $N_2$, $N_3$ of said cavity 303.

The second alternative of the fourth embodiment of the method of the invention may also include an optional third step d or similar phases to phases b1, b5 and b3, b7 to confine layer 315 within cavity 303. Likewise, another optional step e may be performed before step c, which consists in filling cavity 303, coated with synthetic carbon allotrope based material 315, with a second material so as to obtain, after step c, a micromechanical part made of a synthetic carbon allotrope based material 315 which is strengthened by and/or decorated with a second material, as in the aforecited second and third embodiments.

In a last step c of the second alternative of the fourth embodiment, the method consists in removing substrate 301, to release the micromechanical part with several functional levels $F_1$, $F_2$, $F_3$, at least partially formed in cavity 303, with the same variants and advantages as in the first three embodiments.

In the second alternative illustrated to the right of FIG. 22, there is obtained a micromechanical part, formed exclusively of layer 315, the geometry of which at least partially matches cavity 303. Advantageously, the external surface, i.e. the surface which was directly in contact with substrate 301, has a very good roughness, i.e. comparable to that of substrate 301, and is preferably used as the mechanical contact surface.

In the example illustrated to the right of FIG. 22, it is possible to envisage forming a watch dial 321. There is therefore obtained a micromechanical part 321 including a first functional level $F_1$ formed of feet 327 intended to cooperate with a timepiece main plate. Micromechanical part 231 also includes a second functional level $F_2$ formed of a hollow main body 323 forming most of the visible part of the dial and a third functional level $F_3$ forming at least one protuberance of main body 325 able to serve as a one-piece applique 325. FIG. 22 thus shows that that the thickness of main body 323, of protuberance 325 and of feet 327 is formed by the thickness $e_1$ of layer 315 deposited in step b of the method.

Figure 23:
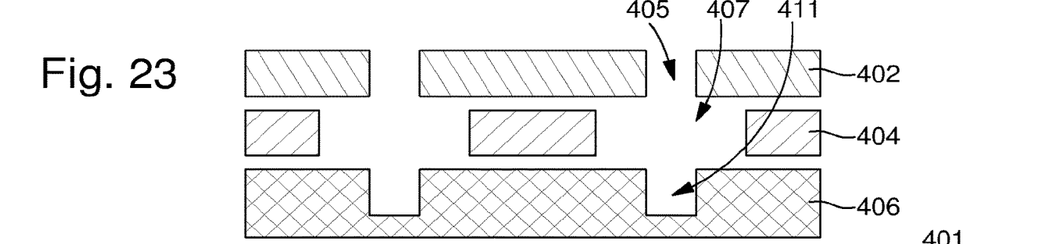
FIGS. 23 to 26 are representations of successive steps of a fabrication method according to a fifth embodiment of the invention.
Figure 24:
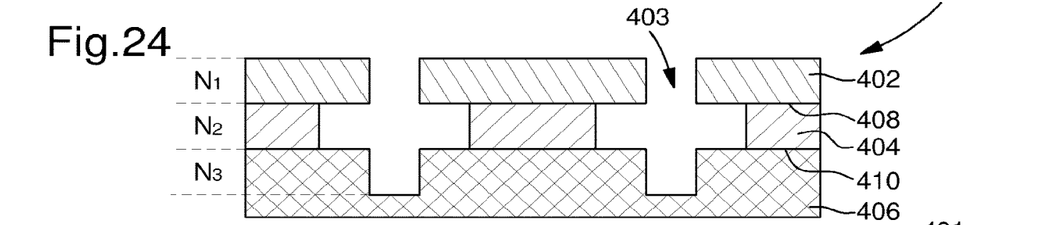
Figure 25:
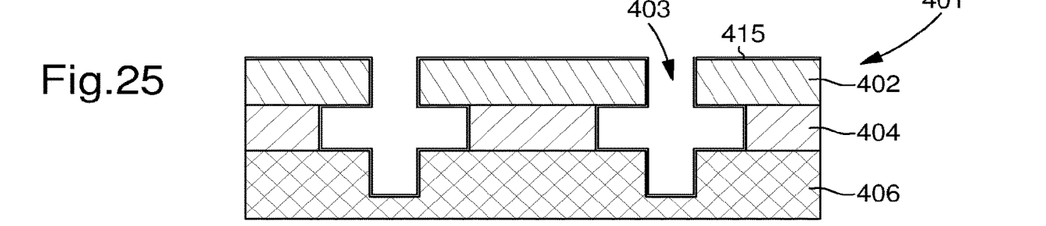

In step a of the fifth embodiment illustrated in FIGS. 23 and 24, three wafers 402, 404, 406 are etched in a pattern required for an associated level $N_1$, $N_2$, $N_3$. Thus, in step a, a first phase a18 is intended to form a first wafer 402 including a first pattern 405 etched through, a second phase a19 intended to form a second wafer 404 including a second pattern 407 etched through, and a third phase a20 consisting of forming a third wafer 406 including an etched, non-through pattern 411, i.e. with no through pattern. In a last phase a21, step a of the fifth embodiment finishes by bonding wafers 402, 404, 406 with the aid of layers 408, 410 formed by fusion bonding, to form substrate 401 including a negative cavity 403 on three levels $N_1$, $N_2$, $N_3$, respectively formed of patterns 405, 407 and 411.

After step a, the fifth embodiment continues with step b, in which negative cavity 403 of substrate 401 is coated with a layer 415 of synthetic carbon allotrope based material of smaller thickness $e_1$ than the depth of each of said three levels $N_1$, $N_2$, $N_3$, of said cavity 403.

The fifth embodiment of the method of the invention may also include an optional third step d or similar phases to phases b1, b5 and b3, b7 to confine layer 415 within cavity 403. Likewise, another optional step e may be performed before step c, which consists in filling cavity 403, coated with synthetic carbon allotrope based material 415, with a second material so as to obtain, after step c, a micromechanical part made of a synthetic carbon allotrope based material 415 which is strengthened by and/or decorated with a second material, as in the aforecited second and third embodiments.

In a last step c of the fifth embodiment, the method consists in removing substrate 401, so as to release the micromechanical part with several functional levels $F_1$, $F_2$, $F_3$ at least partially formed in cavity 403, with the same variants and advantages as in the three first embodiments.

Figure 26:
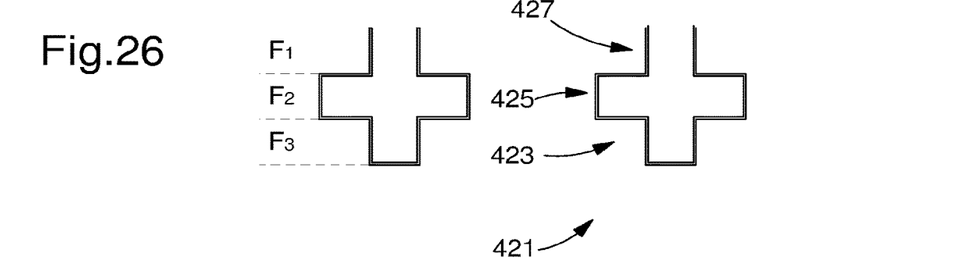

In the example illustrated in FIG. 26, there is obtained a micromechanical part, formed exclusively of layer 415, the geometry of which at least partially matches cavity 403. Advantageously, the external surface, i.e. the surface which was directly in contact with substrate 401, has very good roughness, i.e. comparable to that of substrate 401, and is preferably used as the mechanical contact surface.

In the example illustrated in FIG. 26, it is possible to envisage forming a timepiece wheel set 421. There is therefore obtained a micromechanical part 421 including a first functional level $F_1$ formed of a pivot 427 intended to cooperate with a first timepiece bearing. Micromechanical part 421 also includes a second functional level $F_2$ formed of a hollow flared body 425 forming a wheel with a toothing and a third functional level $F_3$ formed of a second pivot 423 intended to cooperate with a second timepiece bearing. FIG. 26 thus shows that that the thickness of pivots 423, 427 and of wheel 425 is formed by the thickness $e_1$ of layer 415 deposited in step b of the method.

Figure 27:
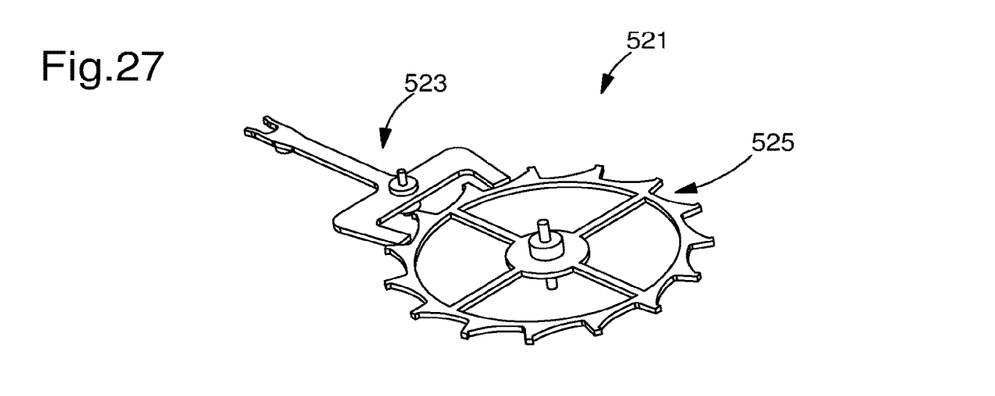
FIG. 27 is a representation of two examples of micromechanical parts obtained according to the fourth and fifth embodiments of the invention.

Consequently, it is understood that the method makes it possible to form a micromechanical part comprising several functional levels $F_1$, $F_2$, $F_3$, $F_x$, with no height limitation. By way of non-limiting example illustrated in FIG. 27, it is therefore possible to form a Swiss lever escapement 521 entirely made of diamond. Thus, it is noted that it is possible for the thickness of hollow, one-piece pallets 523, i.e. the pallet-stones, pallet-staff, pallet-lever, pallet-fork and guard pin, to be formed exclusively by the thickness $e_1$ of the layer deposited in step b of the method of the invention. Likewise, it is also possible for the thickness of the hollow, one-piece escape wheel 525, i.e. the wheel and pivots, to be formed exclusively by the thickness $e_1$ of the layer deposited in step b of the method of the invention.

Of course, this invention is not limited to the illustrated example but is capable of various variants and modifications that will appear to those skilled in the art. In particular, several micromechanical parts 21, 51, 81, 221, 321, 421, 523, 525, which may or may not be of identical design, may be fabricated at the same time on the same substrate 1, 41, 71, 101, 201, 301, 401 and possibly even an SOI.

Consequently, it is not only possible for several identical or non-identical cavities 3, 43, 73, 103, 203, 303, 403 to be formed on the substrate 1, 41, 71, 101, 201, 301, 401, but they may also be formed on several faces of the substrate 1, 41, 71, 101, 201, 301, 401, i.e. the steps of the various embodiments of the method can be applied to several faces of the substrate 1, 41, 71, 101, 201, 301, 401.

The invention claimed is:

1. A wheel set, comprising:
a plurality of functional levels, at least two of the functional levels being formed in a one-piece manner of a synthetic carbon allotrope based material,
wherein the carbon allotrope based material is in a carbon allotrope layer of thickness in a range of from 0.2 to 20 µm,
wherein the carbon allotrope layer has a height greater than its thickness,
wherein the wheel set has a hollow space containing a volume forming several perfectly referenced functional levels able to directly comprise a pivot axis,
wherein an external surface of the wheel set comprises a first toothing,
wherein a first level of the plurality of the functional levels comprises a first discoid plate extending in a height direction, orthogonal to a plane formed by the first discoid plate, and comprising a first hole and a first part of the volume,
wherein the first hole communicates with a second level of the plurality of functional levels,
wherein, from the first level extends a first hub, coaxially to the first hole, connecting a plurality of arms to a felloe of the first discoid plate,
wherein the first toothing projects orthogonally from an outer periphery of the felloe,
wherein the first part of the volume of the first level is at least partially filled with a second material,
wherein the second material projects from in the height direction of the external surface to form an additional functional element of the wheel sets
wherein the second level of the plurality of the functional levels comprises a second discoid plate extending in the height direction and comprising a second hole and a second part of the volume,
wherein from the second level extends a second hub, coaxially to the second hole, from a periphery of a second toothing connected to the second hub, and
wherein the first discoid plate is connected to the second discoid plate via the plurality of arms.

2. The wheel set of claim 1, wherein the second material comprises a metal.

3. The wheel set of claim 1,
wherein the second hole is configured to cooperate with an arbor.

4. The wheel set of claim 1, wherein the second part of the volume, from the second level, is at least partially filled with the second material.

5. The wheel set of claim 1,
wherein the first hole cooperates with an arbor.

6. The wheel set of claim 5, wherein from the first level extends a first hub, coaxially to the first hole, from a periphery of the first toothing connected to the first hub.

7. The wheel set of claim 6,
wherein the second hole communicates with the first level.

8. The wheel set of claim 7,
wherein the second toothing projects orthogonally outward from the second discoid plate.

9. The wheel set of claim 1, further comprising:
a third level of the plurality of functional levels, formed exclusively of the second material,
wherein the third level comprises:
(i) a third discoid plate extending in the height direction and comprising a third hole, the third hole communicating with the second level; and
(ii) a peripheral third toothing.

10. A timepiece, comprising:
the wheel set of claim 1.

11. The wheel set of claim 1, wherein the second material comprises a metal alloy.

12. The Wheel set of claim 1, wherein the first and the second level, together, have a height in a range of from 20 to 1000 µm.

13. The wheel set of claim 1, comprising three levels of toothing across its height.

14. The wheel set of claim 1, wherein the plurality of arms have an upper side and a lower side, opposite the upper side, the timepiece comprising:
the first toothing, projecting orthogonally from the periphery of the felloe on the upper side of the plurality of arms; and
the second toothing, projecting orthogonally from the periphery of the felloe on the lower side of the plurality of arms.

15. The wheel set of claim 1, wherein the first and second levels are formed in a one-piece manner of a synthetic carbon allotrope based material.

16. The wheel set of claim 1, wherein the plurality of arms comprise strengthening structures which are radial or ribbed.

17. The wheel set of claim 1, wherein the synthetic carbon allotrope based material is diamond.

18. The wheel set of claim 1, wherein the synthetic carbon allotrope based material is diamond-like carbon.

19. The wheel set of claim 1, wherein the synthetic carbon allotrope based material is graphene.

\* \* \* \* \*